(12) United States Patent
Indukumar et al.

(10) Patent No.: US 7,079,467 B2
(45) Date of Patent: Jul. 18, 2006

(54) DATA PROCESSING APPARATUS AND METHOD FOR D=2 OPTICAL CHANNELS

(75) Inventors: Kalahasthi Chenchu Indukumar, Singapore (SG); Lei Bi, Singapore (SG)

(73) Assignee: Data Storage Institute (SG)

( * ) Notice: Subject to any disclaimer, the term of this patent is extended or adjusted under 35 U.S.C. 154(b) by 835 days.

(21) Appl. No.: 09/941,106

(22) Filed: Aug. 28, 2001

(65) Prior Publication Data

US 2002/0114247 A1    Aug. 22, 2002

(51) Int. Cl.
*G11B 20/10* (2006.01)
*G11C 29/00* (2006.01)

(52) U.S. Cl. .................................. 369/59.22; 714/746

(58) Field of Classification Search ............. 369/44.11, 369/44.26, 44.35, 47.32, 47.33, 47.34, 47.35, 369/53.35, 53.44, 59.11, 59.12, 59.17, 59.21, 369/59.22
See application file for complete search history.

(56) References Cited

U.S. PATENT DOCUMENTS

| | | | | |
|---|---|---|---|---|
| 4,961,182 A | * | 10/1990 | Saito et al. ............. | 369/124.15 |
| 5,054,017 A | * | 10/1991 | Hiroyoshi et al. ....... | 369/275.1 |
| 5,961,658 A | | 10/1999 | Reed et al. ................. | 714/746 |
| 5,986,987 A | * | 11/1999 | Taguchi et al. .......... | 369/47.35 |
| 6,111,833 A | * | 8/2000 | Nakagawa et al. ....... | 369/59.23 |
| 6,249,398 B1 | * | 6/2001 | Fisher et al. .................. | 360/65 |

FOREIGN PATENT DOCUMENTS

| | | |
|---|---|---|
| EP | 0 881 639 A2 | 12/1998 |
| EP | 0 899 885 A2 | 3/1999 |
| EP | 1 056 084 A2 | 11/2000 |
| GB | 2 344 730 A | 6/2000 |
| JP | 04167820 A | 6/1992 |
| JP | 05205409 A | 8/1993 |
| JP | 09007313 A | 1/1997 |
| JP | 10293973 A | 11/1998 |

* cited by examiner

*Primary Examiner*—Thang V. Tran
(74) *Attorney, Agent, or Firm*—Fish & Richardson P.C.

(57) ABSTRACT

A data processing apparatus having a partial response forward equalizer (filter) with sufficient number of taps to result in 7-tap target response, designed by jointly optimizing the target response and the target coefficients to maximize an appropriate signal-to-noise ratio (SNR) at the detector input, followed by a new post-processing scheme enhances performance of the threshold based bit-by-bit detector designed for the d=2 optical channels. The resulting performance of the proposed scheme over a range of channel densities of 4.5 and below (used on EFM/EFMPlus coded channels for CD/DVD), is close to maximum-likelihood bound (MLB), and it is better than that of other schemes at channel densities of 4.5 and higher. Advantageously, the detector of the invention is simple in structure compared to conventional partial response Viterbi detector schemes. By processing the detected data in accordance with a set of data correction rules, the invention provides advantageous enhanced detection capacity.

16 Claims, 9 Drawing Sheets

Observation Window

X : + or -
↑ : Location of probable change in sign

Observation Window

X : + or -
↑ : Location of probable change in sign

Observation Window $(\cdot)'$ : Compliment of $(\cdot)$
↑ : Location of probable change in sign

DATA PROCESSING APPARATUS AND METHOD FOR D=2 OPTICAL CHANNELS

FIELD OF THE INVENTION

The present invention relates to the design of a data processing apparatus for reproducing bits of information stored on a disk. More particularly, though not exclusively, the present invention concerns an improved data processing apparatus for optically reproducing bits of information stored on an optical disk.

BACKGROUND OF THE INVENTION

Detection systems, in general, have an equalizer followed by a detector. The equalizer shapes input signal from an optical disk read mechanism to have particular characteristics and the detector processes the equalized signal to retrieve the information stored on the optical disk. Peak detectors, threshold based bit-by-bit detectors with and without simple post-processing for d=2 code constraint violation, and partial response Viterbi detectors are the proposed (or used) detection schemes for DVD channels. Peak detection systems (see prior arts and systems described in U.S. Pat. No. 5,680,380 M. Taguchi et. al, U.S. Pat. No. 6,028,833 Takeshi Maeda et. al, JP 10134489A2 Yokota Hachiro et. al), were perhaps, the first and the simplest detection systems used in optical playback. As the information storage density increases, the detection performance severely degrades due to inter-symbol interference. Threshold based bit-by-bit detectors having symmetrical equalized targets with and without simple post-processing schemes that possibly correct the d=2 code constraint violation (refer to Srini Gopalaswamy et. al "Simple detection technique for d=2 coded optical recording channels", ICC'99 Proceedings, Vancouver, Canada, June 1999, T. Nakagawa et. al "A simple detection method for RLL codes (Run detector), "*IEEE Tr. Magn.*, Vol. 33, No. 5, September 1997) have been proposed. Although these detectors are simple, their bit-error-rate performance is away from maximum achievable performance. Partial response equalizers followed by Viterbi detectors (refer to U.S. Pat. No. 5,680,380, Japan Patent JP101344892A2, and publications J. W. M. Bergmans et. al "Transition detector for CD and DVD," *IEEE Tr. Consumer Electronics*, Vol. 46, No. 1, February 2000, pp.16–19, H. Hayashi et. al "Viterbi decoding circuit for DVD players," *Optical Data Storage*'96, 1996, Chang Hun Lee et. al "A PRML detector for a DVDR system," *IEEE Tr. Consumer Electronics*, Vol. 45, No. 2, May 1999) are the other class of detectors that use complex detection systems. These give poorer performance on shorter target responses due to noise enhancement and for longer target responses, the detectors are enormously complex. The first two preliminary post-processing blocks of the data processing apparatus of the present invention are similar to the scheme given in reference publications Srini Gopalaswamy et. al "Simple detection technique for d=2 coded optical recording channels", *ICC'99 Proceedings*, Vancouver, Canada, June 1999 and T. Nakagawa et. al "A simple detection method for RLL codes (Run detector), "*IEEE Tr. Magn.*, Vol. 33, No. 5, September 1997.

OBJECTS AND SUMMARY OF THE INVENTION

The principal object of the present invention is to overcome or at least substantially reduce some of the above-mentioned drawbacks.

It is an object of the present invention also to provide a data processing apparatus and method which is reliable for detection and has enhanced detection capability and which is capable of achieving performance close to the maximum likelihood lower bound (MLB) over a range of channel densities.

In broad terms, the present invention resides in the concept of taking advantage of the design of building blocks for a simple post-processing method on a zero-threshold detector for a DVD/CD channel, and achieves performance close to the maximum likelihood lower bound (MLB) over a range of channel densities. Because channel densities in DVD/CD change due to both parameter variations and specific optical components used in the detection, this invention, in particular, deals with the design of post-processing blocks and an equalizer to support such processing capability.

Further, a procedure to design the equalizer to have symmetric partial response target of known length and optimum shape, which is unknown apriori, is provided. The resultant target response is also used in post-processing blocks. The post-processor comprises five sub-blocks. The first two blocks are advantageously designed to detect and correct the d=2 code constraint violations, while the other three blocks are designed to increase the reliability of detection of certain data bits which cause the first three dominant error events to occur at the output. The reliability is achieved through minimum energy criterion from the two possible streams of possible outputs. Simulations results are also included hereinafter to show the superior performance of the simple post-processing detector of the invention over a reference 5-tap target partial response Viterbi detector.

Thus, according to one aspect of the present invention there is provided a data processing apparatus comprising: means for generating a signal representative of recorded data on a data storage medium; filtering means for receiving the generated signal and equalising the generated signal response at a predetermined level; and signal correcting means for detecting a plurality of multiple-bit data representative of the equalised signal and processing said multiple-bit data in dependence upon a predetermined set of data correction rules which, in operation of the apparatus, has the effect of enhancing the detection capability of the apparatus.

According to another aspect of the present invention there is provided a data processing system incorporating means for detecting multiple-bit data representative of an equalised signal and means for processing said data in dependence upon a predetermined set of data correction rules such as to enhance the detection capability of the system.

The present invention also extends to a method of enhancing the detection capability of the aforementioned data processing apparatus comprising generating a signal representative of recorded data on a data storage medium; equalising the generated signal response at a predetermined level, and detecting a plurality of multiple-bit data representative of the equalised signal and processing said multiple-bit data in dependence upon a predetermined set of data correction rules.

The above and further features of the present invention are set forth with particularity in the appended claims and will be described hereinafter with reference to the accompanying drawings.

DESCRIPTION OF THE DRAWINGS

FIG. 10A shows detected bits in an observation window and bit positions where possible corrections are made according to Rule 4A in the post-processing block 4a.

DETAILED DESCRIPTION OF THE EMBODIMENT

First, the procedure to design the equalizer is described, and thereafter, the design of post-processing blocks is described. The equalized response is further used in post-processing blocks.

Figure 1:
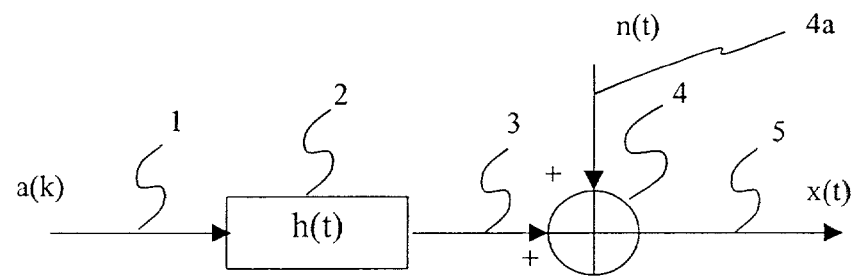
FIG. 1 shows an optical signal channel model with additive white Gaussian channel noise.

In a conventional optical playback system, a focused beam scans a recorded data pattern, which is in the form of pits (mark) and lands of varying length on the optical disk. The data pattern modulates intensity profile of the reflected light beam. Signal changes from a low-to-high (or high-to-low) at the edges of pits and remains high (or low) in between. These changes in the signal for a symbol on the DVD channel is modeled as Gaussian distributed light intensity profile convolved with a rectangular pulse of duration T, where T is the channel symbol period. Referring first to FIG. 1, which shows the conventional optical signal model in schematic form, the response of the channel to a transition at the leading mark edge is represented by g(t), and the symbol response is represented as h(t) (reference numeral 2)=g(t)−g(t−T). The transition response g(t) is then given by $$g(t) = \frac{1}{2} erfc(-2t/ST) \tag{1}$$

where S is the channel density and erfc is the complementary error function. The analog read waveform x(t) (reference numeral 5) from the optical channel is modelled as $$x(t) = \sum_k a_k h(t - kT) + \eta(t) \tag{2}$$

where $\{a_k\}$ (reference numeral 1) is the sequence of coded binary input bits (+1,−1) and n(t) (reference numeral 4a) is the additive white Gaussian noise(AWGN) with zero-mean and variance $\sigma_n^2$ determined by the channel SNR defined as $$SNR = 10 \log 10(A^2/R\sigma_n^2), A=2, R=0.5 \text{ (for EFMPlus code)} \tag{3}$$

In equation (3), R is the code-rate and A is twice the peak-amplitude of the channel response h(t).

Figure 2:
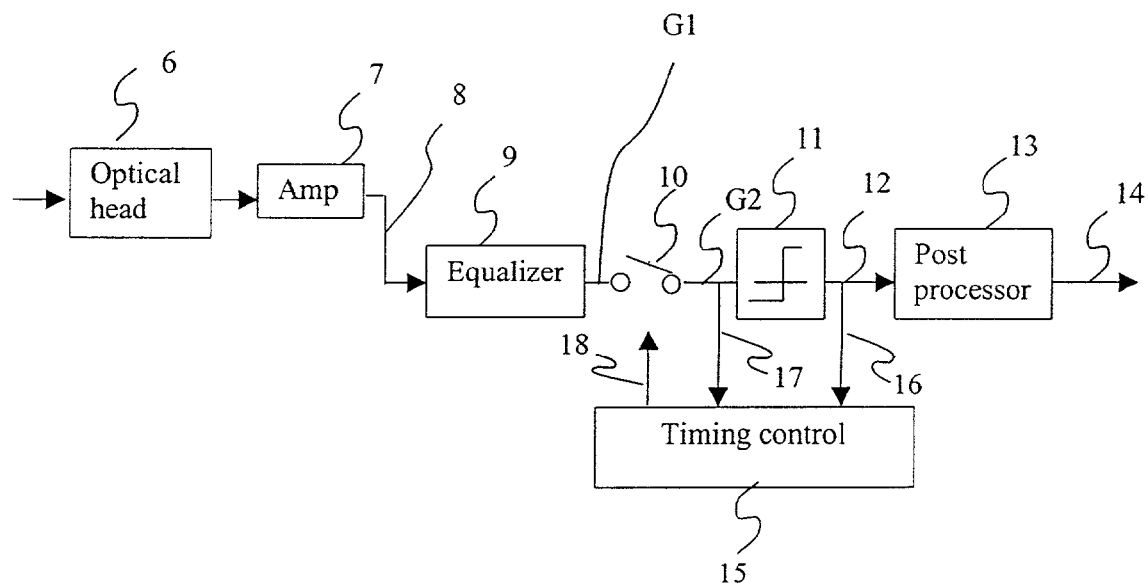
FIG. 2 shows a schematic of a detection circuit of the invention with zero-threshold and post-processing blocks.

FIG. 2 is a schematic of the data processing system of the invention. As shown, the data processing system has an optical head 6 to read analog signal 5 from the optical disk (not shown), which is then amplified suitably by an amplifying unit 7, equalized by analog filter 9 to have specific characteristics, sampled at T equal time intervals by a sampler 10, passed to zero-threshold detector 11 (also called slicer) that gives binary output {+1 or −1}, post processed by processor 13 to correct any identified erroneous bits, and provide a stream of binary data {+1 or −1 } through output 14 to other processing blocks. The system also has a timing control unit 15 that takes the input and output of the slicer 11 to provide accurate sampling clock pulses to the sampler 10.

Design of equalizer 9 to have specific characteristics for the signal is one of the key factors in the design of the detection system. First, the design of the system of the invention provides a fractionally spaced discrete time FIR equalizer 9 to keep the system performance as close to analog system as possible. The over-sampled signal $\tilde{y}_m$ at the output of equalizer 9 at the m-th instant in over sampled index is given by $$\tilde{y}_m = \sum_{j=0}^{N-1} x_{(m+n_0-j)\tau} w_j \tag{4}$$

where $\tau = T/_{66}$ is the over sampled time interval with $\Delta$ being the over sampling factor, $n_0$ is the sampling phase, $w_j, j= 0,1,\ldots,(N-1)$ are the weights of the equalizer (filter) 9, and $x_{(k+n_0-j)\tau}$ is the signal x(t) 8 at $t=(k+n_0-j)T/\Delta$. From (2) and (4), after down sampling $\tilde{y}_m$ and simplification, the signal at symbol rate in terms of input bits 1 is given as $$y_k = \sum_{m=-Q}^{Q} f_m a_{k-m} + \sum_{j=o}^{N-1} w_j \eta_{k\Delta+n_0-j}, \tag{5}$$

where $\{f\}$, $\{\underline{h}\}$, and $\{\underline{w}\}$ are related as $$\begin{bmatrix} f_{-Q} \\ \vdots \\ f_Q \end{bmatrix} = \begin{bmatrix} h_{n_0-Q\Delta} & \cdots & h_{n_0-(N-1)-Q\Delta} \\ \vdots & \cdots & \vdots \\ h_{n_0+Q\Delta} & \cdots & h_{n_0-(N-1)+Q\Delta} \end{bmatrix} \begin{bmatrix} w_0 \\ \vdots \\ w_{N-1} \end{bmatrix} \quad (6)$$

Representing in vector notation, we have $\underline{f} = H^T \underline{w}$.
The desired signal $S_k$ will be of the form $$S_k = f_{-Q} a_{k+Q} + \ldots + f_0 a_k + \ldots + f_Q a_{k-Q} = \underline{f}^T \underline{a}_Q = \underline{w}^T H \underline{a}_Q \quad (7)$$

where $\underline{a}_Q = [a_{k+Q}, \ldots, a_k, \ldots, a_{k-Q}]^T$. The mean squared error $\zeta_\eta$ is given by $$\zeta_\eta = E[(y_k - s_k)^2] = E[(\underline{w}^T \underline{x} - \underline{w}^T H \underline{a}_Q)^2] = \underline{w}^T R_\zeta \underline{w}, \quad (8)$$

where $R_{\zeta_\eta} = E[(\underline{x} - H\underline{a}_Q)(\underline{x} - H\underline{a}_Q)^T]$. Let constraints on the weights $\underline{w}$ be represented as $C^T \underline{w} = \underline{g}$. Using Lagrange's method, the minimization problem and compute equalizer weights can be solved as $$\underline{w} R_{\zeta_\eta}^{-1} C [C^T R_{\zeta_\eta}^{-1} C]^{-1} \underline{g} \quad (9)$$

For $f_0 = 1$ and $G$ pre- and post-cursors to be equal (($f_{-1} = f_1$), ..., ($f_{-G} = f_G$)), $$C = \begin{bmatrix} h_{n_0}, h_{n_0-1}, \cdots, h_{n_0-(N-1)} \\ (h_{n_0+\Delta}, h_{n_0-1+\Delta}, \cdots, h_{n_0-(N-1)+\Delta}) - (h_{n_0-\Delta}, h_{n_0-1-\Delta}, \cdots, h_{n_0-(N-1)-\Delta}) \\ \vdots \\ (h_{n_0+G\Delta}, h_{n_0-1+G\Delta}, \cdots, h_{n_0-(N-1)+G\Delta}) - (h_{n_0-G\Delta}, h_{n_0-1-G\Delta}, \cdots, h_{n_0-(N-1)-G\Delta}) \end{bmatrix}^2 \quad (10)$$

$$\underline{g} = \begin{bmatrix} 1 \\ 0 \\ \vdots \\ 0 \end{bmatrix}_{G\text{-zeros}}$$

and signal power- $\zeta_s$ is given by $\zeta_s = \underline{w}^T R_{\zeta_s} \underline{w}$, where $R_{\zeta_s} = HE[\underline{a}_Q \underline{a}_Q^T]H^T$. The signal-to-noise ratio (SNR) for a given $n_0$ is computed as $$SNR(n_0) = \frac{\zeta_s(n_0)}{\zeta_\eta(n_0)} \quad (11)$$

and optimum sampling phase is determined by searching all sampling phases and choosing the phase that gives the best detection SNR.

Figure 3:
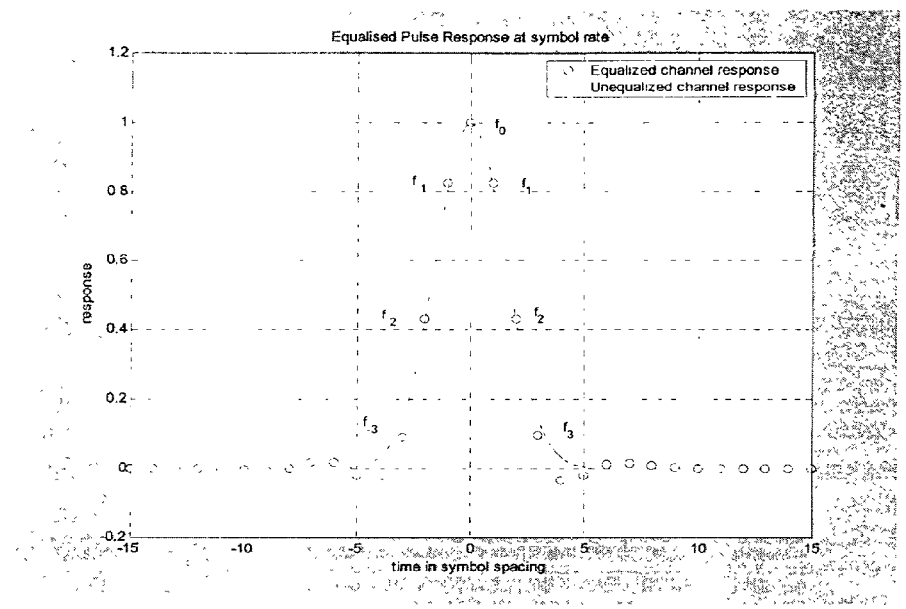
FIG. 3 is a typical equalized optical channel response with seven-tap target response.

Preferably, the length of the equalized target is 7, this being the optimum length that supports d=2 code constrained signals in the present scheme. This choice of 7 coefficient target response results in 16 levels of noise-free signals for EFMPlus coded binary input bits (+1,−1). A typical equalizer symbol response for a representative DVD channel with density 4.23 along with an unequalized channel response for comparison is given in FIG. 3. When the sampled signal is passed through the slicer 11, the sign of the signal at the slicer 11 output 12 gives the estimate of symbol $a_k$. Table 1 gives all the input symbol patterns of length 7 satisfying the d=2 code constraint with $a_k$=+1 and the corresponding ideal values (i.e., no noise and no ISI) of equalizer outputs, and similarly, Table 2 gives the patterns and corresponding ideal values of equalizer output values for $a_k$=−1.

Having regard to the foregoing, the equalizer is advantageously designed to optimise signal-to-noise (SNR) at the detector input for a known length of input symbol pattern with constraints on the target shape, but unknown shape apriori, for use with the post-processing scheme. While in the described embodiment the length of the equalized target is 7 (7-tap), the equalizer design can be modified to accommodate another target length by change of parameters and constraints.

Figure 4:
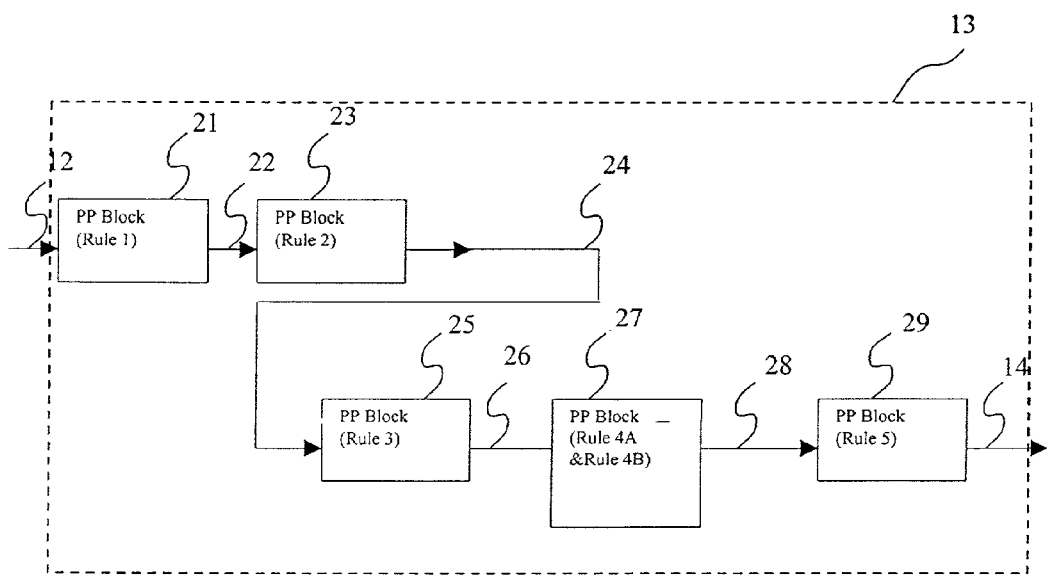
FIG. 4 shows a schematic of a post-processing circuit of the invention with sub-blocks each operating by specific rules.

Assuming that the detected bits at time instants (k−3), (k−2), (k−1), (k+1), (k+2), (k+3) are correct, we note from the tables that there will be the d=2 code constraint violation if a bit from patterns of rows 1 to 2 and 5 to 13 are detected erroneously at the k-th instant. By applying post-processing to the output sequence 12 in accordance with a set of data correction rules, as schematically shown in FIG. 4, these bits can be corrected. To this extent post processing blocks 21, 23 should correct d=2 code constraint violation with high probability.

TABLE 1

Symbol patterns of length 7 satisfying the d = 2 code constraint and the corresponding ideal values of equalizer outputs with $a_k$ = +1.

| j | $a_{k-3}$ | $a_{k-2}$ | $a_{k-1}$ | $a_k$ | $a_{k+1}$ | $a_{k+2}$ | $a_{k+3}$ | $z_k$ | outputs |
|---|---|---|---|---|---|---|---|---|---|
| 1 | −1 | −1 | −1 | +1 | +1 | +1 | −1 | $f_0 - 2f_3$ | 0.8114 |
| 2 | −1 | +1 | +1 | +1 | −1 | −1 | −1 | $f_0 - 2f_3$ | 0.8114 |
| 3 | −1 | −1 | −1 | +1 | +1 | +1 | +1 | $f_0$ | 1.0000 |
| 4 | +1 | +1 | +1 | +1 | −1 | −1 | −1 | $f_0$ | 1.0000 |
| 5 | −1 | −1 | +1 | +1 | +1 | −1 | −1 | $f_0 + 2f_1 - 2f_2 - 2f_3$ | 1.5984 |

TABLE 1-continued

Symbol patterns of length 7 satisfying the d = 2 code constraint and the corresponding ideal values of equalizer outputs with $a_k$ = +1.

| j | $a_{k-3}$ | $a_{k-2}$ | $a_{k-1}$ | $a_k$ | $a_{k+1}$ | $a_{k+2}$ | $a_{k+3}$ | $z_k$ | outputs |
|---|---|---|---|---|---|---|---|---|---|
| 6 | −1 | −1 | +1 | +1 | +1 | +1 | −1 | $f_0 + 2f_1 − 2f_3$ | 2.4568 |
| 7 | −1 | +1 | +1 | +1 | +1 | −1 | −1 | $f_0 + 2f_1 − 2f_3$ | 2.4568 |
| 8 | −1 | −1 | +1 | +1 | +1 | +1 | +1 | $f_0 + 2f_1$ | 2.6454 |
| 9 | +1 | +1 | +1 | +1 | +1 | −1 | −1 | $f_0 + 2f_1$ | 2.6454 |
| 10 | −1 | +1 | +1 | +1 | +1 | +1 | −1 | $f_0 + 2f_1 + 2f_2 − 2f_3$ | 3.3152 |
| 11 | −1 | +1 | +1 | +1 | +1 | +1 | +1 | $f_0 + 2f_1 + 2f_2$ | 3.5038 |
| 12 | +1 | +1 | +1 | +1 | +1 | +1 | −1 | $f_0 + 2f_1 + 2f_2$ | 3.5038 |
| 13 | +1 | +1 | +1 | +1 | +1 | +1 | +1 | $f_0 + 2f_1 + 2f_2 + 2f_3$ | 3.6924 |

TABLE 2

Symbol patterns of length 7 satisfying the d = 2 code constraint and the corresponding ideal values of equalizer outputs with $a_k$ = −1.

| j | $a_{k-3}$ | $a_{k-2}$ | $a_{k-1}$ | $a_k$ | $a_{k+1}$ | $a_{k+2}$ | $a_{k+3}$ | $z_k$ | outputs |
|---|---|---|---|---|---|---|---|---|---|
| 1 | +1 | +1 | +1 | −1 | −1 | −1 | +1 | $-(f_0 − 2f_3)$ | −0.8114 |
| 2 | +1 | −1 | −1 | −1 | +1 | +1 | +1 | $-(f_0 − 2f_3)$ | −0.8114 |
| 3 | +1 | +1 | +1 | −1 | −1 | −1 | −1 | $-(f_0)$ | −1.0000 |
| 4 | −1 | −1 | −1 | −1 | +1 | +1 | +1 | $-(f_0)$ | −1.0000 |
| 5 | +1 | +1 | −1 | −1 | −1 | +1 | +1 | $-(f_0 + 2f_1 − 2f_2 − 2f_3)$ | −1.5984 |
| 6 | +1 | +1 | −1 | −1 | −1 | −1 | +1 | $-(f_0 + 2f_1 − 2f_3)$ | −2.4568 |
| 7 | +1 | −1 | −1 | −1 | −1 | +1 | +1 | $-(f_0 + 2f_1 − 2f_3)$ | −2.4568 |
| 8 | +1 | +1 | −1 | −1 | −1 | −1 | −1 | $-(f_0 + 2f_1)$ | −2.6454 |
| 9 | −1 | −1 | −1 | −1 | −1 | −1 | +1 | $-(f_0 + 2f_1)$ | −2.6454 |
| 10 | +1 | −1 | −1 | −1 | −1 | −1 | +1 | $-(f_0 + 2f_1 + 2f_2 − 2f_3)$ | −3.3152 |
| 11 | +1 | −1 | −1 | −1 | −1 | −1 | −1 | $-(f_0 + 2f_1 + 2f_2)$ | −3.5038 |
| 12 | −1 | −1 | −1 | −1 | −1 | −1 | +1 | $-(f_0 + 2f_1 + 2f_2)$ | −3.5038 |
| 13 | −1 | −1 | −1 | −1 | −1 | −1 | −1 | $-(f_0 + 2f_1 + 2f_2 + 2f_3)$ | −3.6924 |

It can be observed from Table 1 that a single bit error in patterns 3 and 4 results in a shift in location of transition of polarity change. For, example, pattern 3 in Table 1 will be erroneously detected as pattern 4 in Table 2. There is a possibility of single bit error when the detected sequence has the pattern $\pm\{+1,+1,+1,X,-1,-1,-1,\}$. Therefore, whenever such a pattern is detected in the original sequence $X_m^A$, m=0, ..., 4L, another sequence $X_m^B$, m=0, ..., 4L with the bit at X-position flipped is first formed, and the cumulative error energies of both the sequences are computed, and then the bit associated with the least energy sequence is selected. Let $e^A$ and $e^B$ represent cumulative energies in the two sequences computed at observation instant k as $$e^A = \sum_{j=k-L}^{k+L} \left( y_j - \sum_{i=-L}^{i=L} X_{i+j-k+2L}^A f_i \right)^2 \quad (12)$$

$$e^B = \sum_{j=k-L}^{k+L} \left( y_j - \sum_{i=-L}^{i=L} X_{i+j-k+2L}^B f_i \right)^2.$$

Sequence $X^B$ is selected if $(e^B - e^A) < 0$. In actual implementation, it is not required to have a separate sequence $X^B$ as the criterion $(e^B - e^A) < 0$ does not need Sequence $X^B$ explicitly, which will be explained hereinafter.

Since dominant error events control the bit-error-rate in partial response Viterbi detection, the first three dominant error events are identified, as shown in Table 3, and include three post-processing blocks to correct the bits that cause these error events based on energy criterion. In the following, there is included a common processing block for third error-event for both the densities shown in the Table. It may noted that the inclusion or deletion of one of the sub-blocks in the common processing block of FIG. 4 changes the performance only marginally.

TABLE 3

First three dominant error events and their distances.

| j | Error event ($\epsilon$) | d(S = 3.0) | d(S = 4.5) |
|---|---|---|---|
| 1 | ±{+} | 1.5440 | 1.6750 |
| 2 | ±{+00−} | 1.9198 | 1.9198 |
| 3 | ±{+00−00+} | — | 2.1422 |
| 4 | ±{+000−} | 2.117 | — |

Figure 5A:
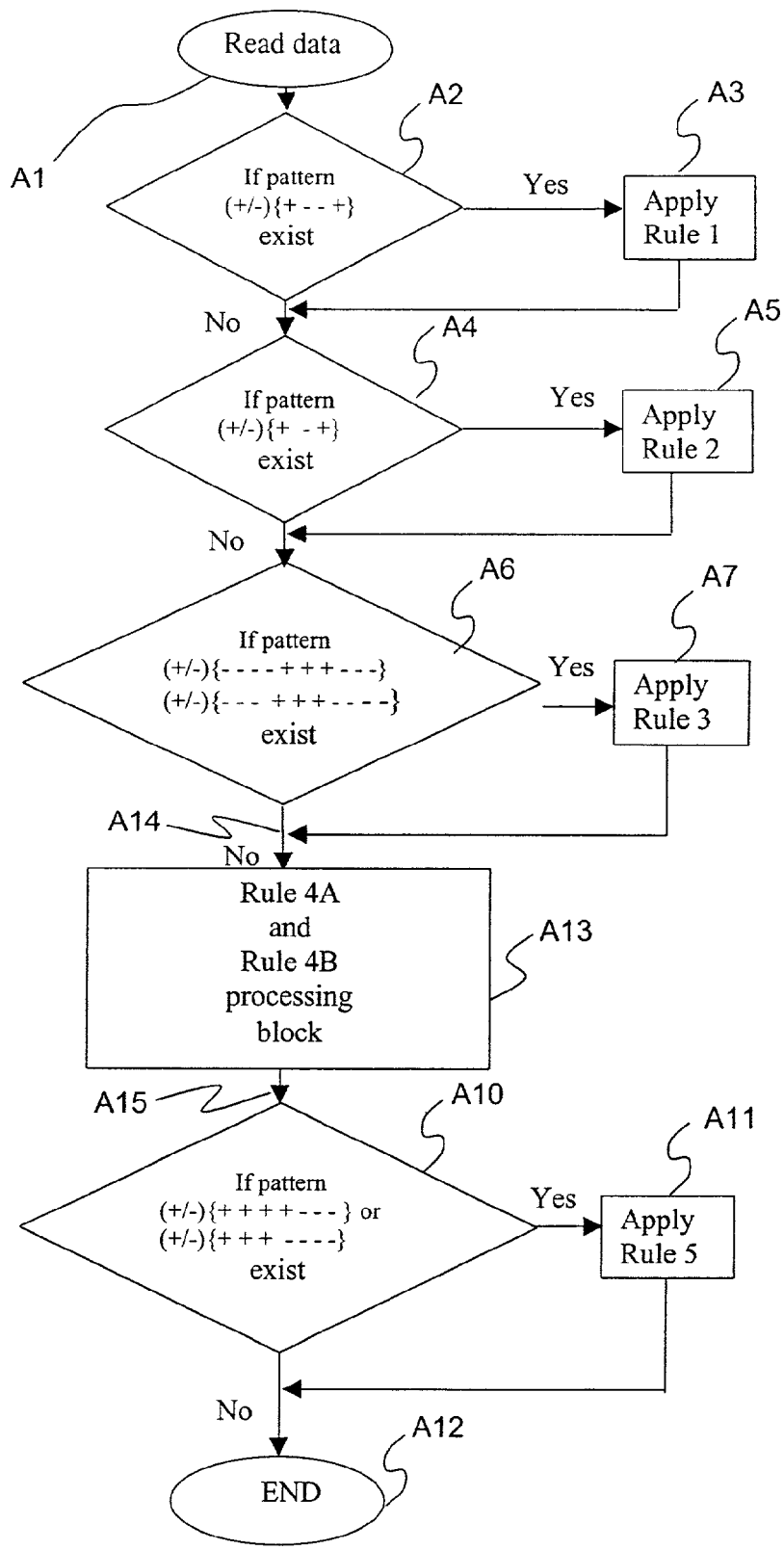
FIG. 5A shows a flow chart of the post-processing circuit of FIG. 4.
Figure 5B:
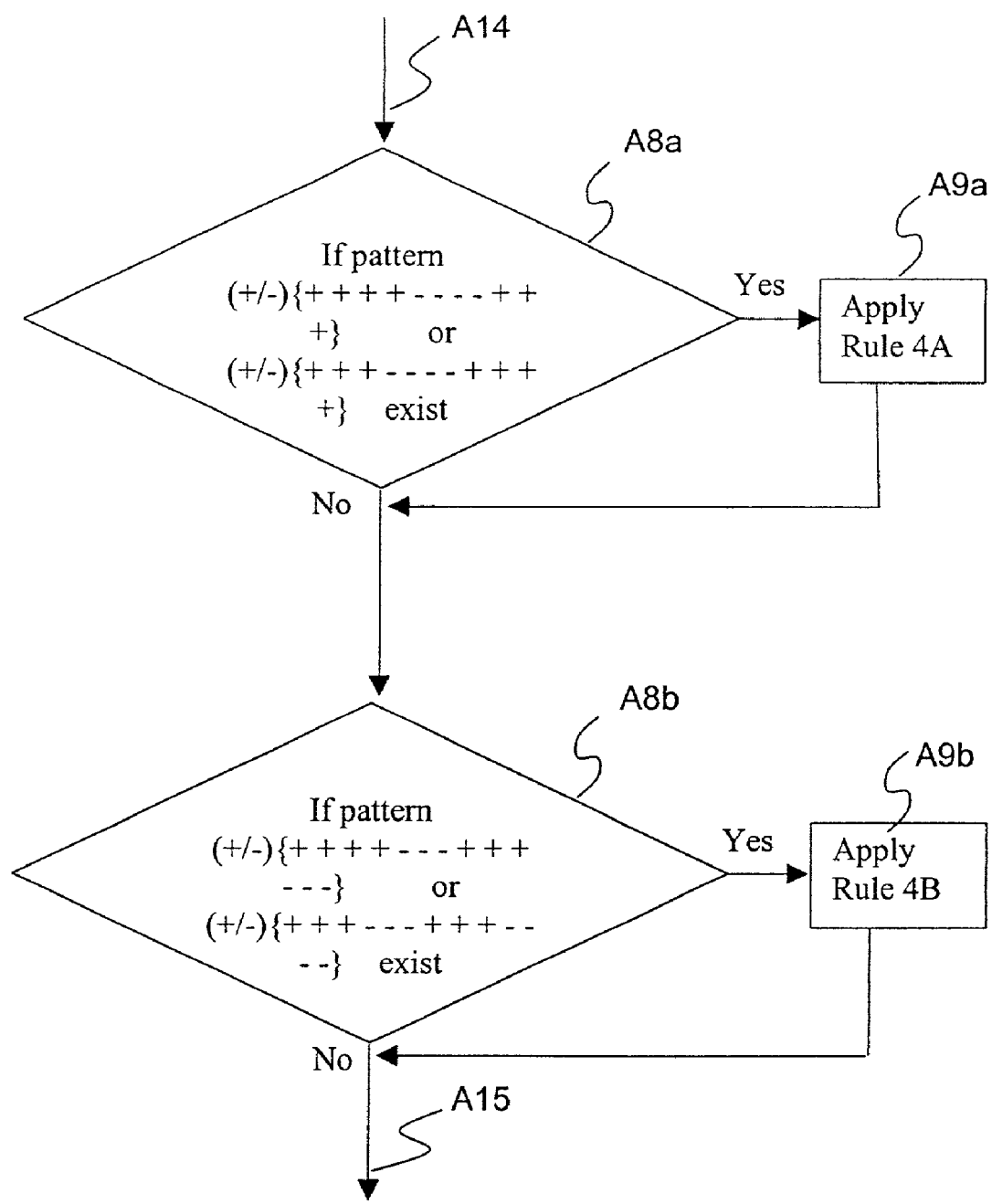
FIG. 5B shows a flow chart of the post-processing circuit of FIG. 4 operating in accordance with Rules 4A and 4B.
Figure 6A:
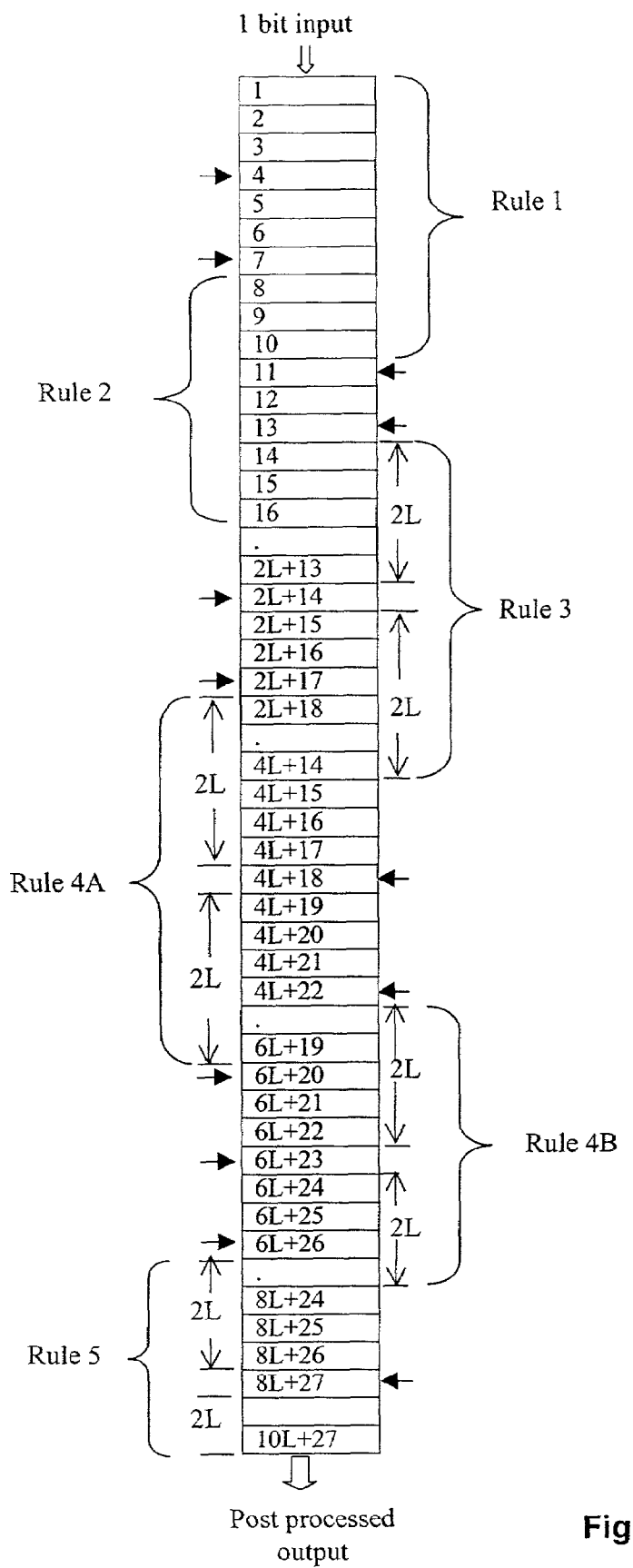
FIG. 6A is a schematic showing portions on the output shift-register where sub-block processing rules are applied and locations of possible bit corrections, which are indicated by left and right arrows.
Figure 6B:
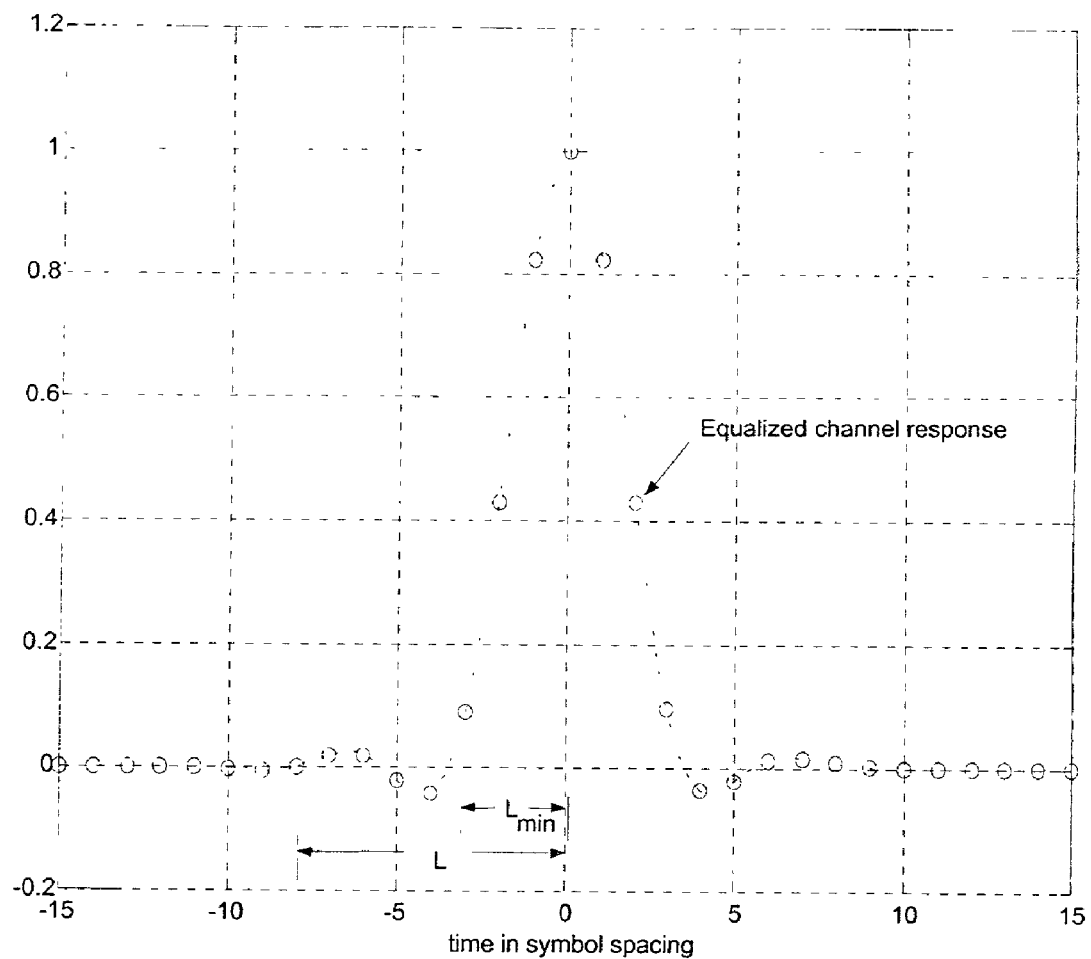
FIG. 6B gives the selection procedure of a parameter (referred in FIG. 6A) in post-processing.
Figure 7:
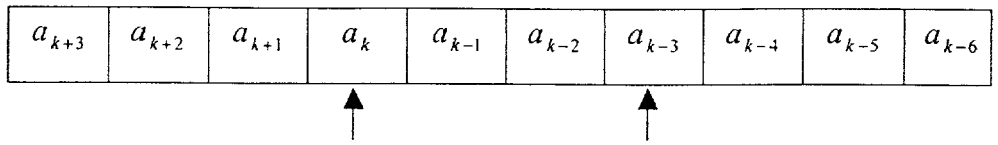
FIG. 7 shows detected bits in an observation window and bit positions where possible corrections are made according to Rule 1 in the post-processing block 1.
Figure 8:
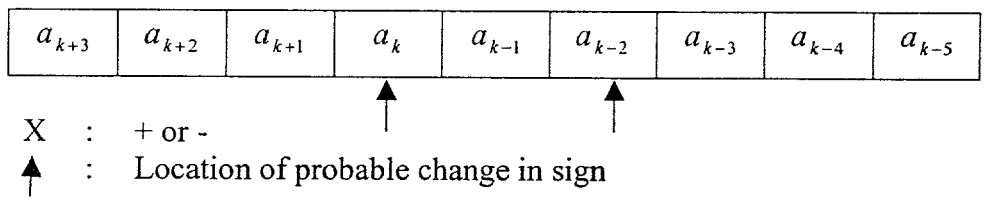
FIG. 8 shows detected bits in an observation window and bit positions where possible corrections are made according to Rule 2 in the post-processing block 2.
Figure 9:
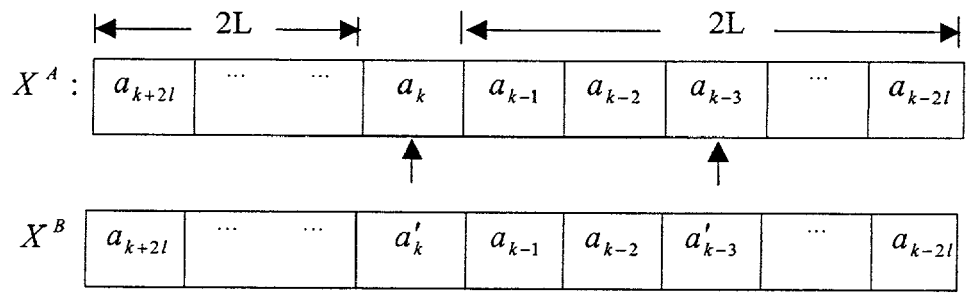
FIG. 9 shows detected bits in an observation window and bit positions where possible corrections are made according to Rule 3 in the post-processing block 3.
Figure 10A:
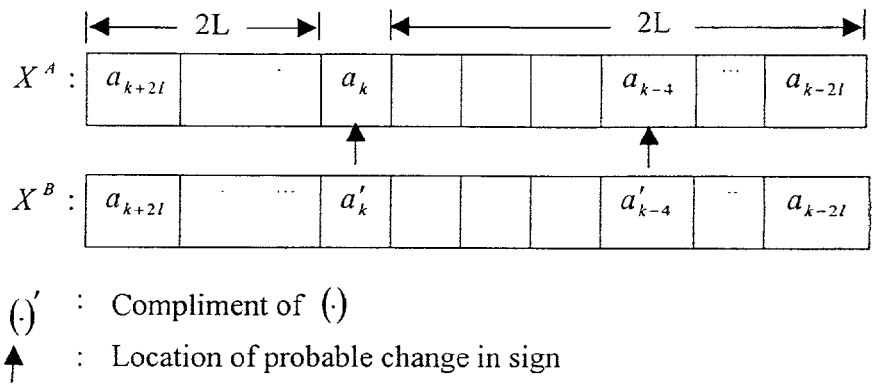
Figure 10B:
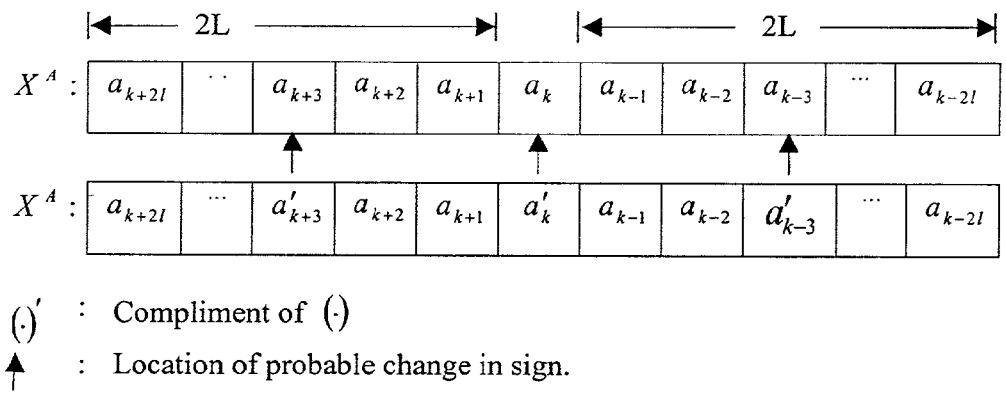
FIG. 10B shows detected bits in an observation window and bit positions where possible corrections are made according to Rule 4B in the post-processing block 4b.
Figure 11:
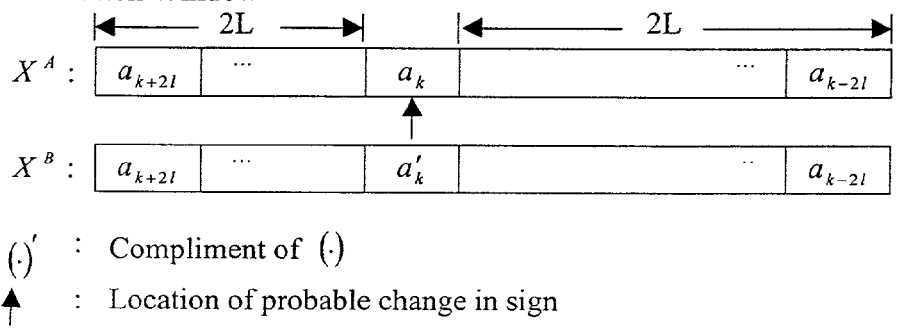
FIG. 11 shows detected bits in an observation window and bit positions where possible corrections are made according to Rule 5 in the post-processing block 5.

$\epsilon$: error event $d = \sqrt{\sum (f \oplus \epsilon)^2}$ $\oplus$: convolution operator Post-processing on the detected sequence is done as shown in further detail in FIGS. 5A, 5B and 6A. First, the data is checked for pattern ±{+--+} in A2. If the pattern is found, Rule 1 (given below) is applied A3 and erroneous bit is corrected, and then proceeds to A4, and if the pattern is not found in A2, bits directly proceed to A4. Second, the data is checked for pattern ±{+-+} in A4. If the pattern is found, Rule 2 (given below) is applied A5 and erroneous bits are corrected, and then proceeds to A6, and if the pattern is not found in A4, bits directly proceed to A6. Third, the data is checked for patterns ±{----+++---} and ±{---+++----} in A6. If the patterns are found, Rule 3 (given below) is applied A7 and erroneous bits are corrected, and then proceeds to A13, and if the patterns are not found in A6, bits directly proceed to A13. Fourth, the data is checked for patterns ±{++++----+++} and ±{+++----++++} in A8a. If the patterns are found, Rule 4A (given below) is applied A9a and erroneous bits are corrected, and then proceeds to A8b, and if the patterns are not found in A8a, bits directly proceed to A8b. Fifth, the data is checked for patterns ±{++++---+++---} and ±{+++---+++----} in A8b. If the patterns are found, Rule 4b (given below) is applied A9b and erroneous bits are corrected, and then proceeds to A10, and if the patterns are not found in A8b, bits directly proceed to A10. Finally, the data is checked for patterns ±{++++---} and ±{+++----} in A10. If the patterns are found, Rule 5 (given below) is applied A11 and erroneous bit is corrected, and then proceeds to end A12, and if the patterns are not found in A10, bits directly proceed to end A12. The rules are applied on different locations on the detected stream of data in the shift register as shown in FIG. 6A. Observation windows for different rules and locations of possible bit corrections are shown in the figure. The value L in the figure is half of non-zero extent of the equalized response as shown in FIG. 6B. As it is clear from the figure, the minimum value of L is 3, but to improve performance it can be increased to 10 or further. The specific data correction rules are given hereinbelow with reference to FIGS. 7 to 10B respectively.

Rule 1: This rule is applied only when $\{a_k, a_{k-1}, a_{k-2}, a_{k-3}\} = \pm\{+--+\}$ in the observation window.

Observation Window

FIG. 7

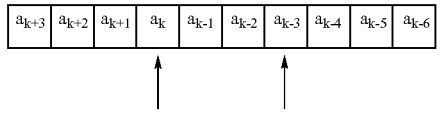

X: + or −

↑: Location of probable change in sign

If observation window has ±{×--+--+×××} or ±{++++--+×××}, flagA is set to 1, otherwise to 0, and if observation window has ±{×××+--+--×} or ±{×××+--++++}, flagB is set to 1, otherwise to 0.

Bit Flipping Logic if ((flagA=1) & (flagB=0)), flip($a_k$)

else if ((flagA=0) & (flagB=1)), flip($a_{k-3}$)

else if(((${y_k} > {y_{k-2}}$ & ($a_k$=+1) ) or (${y_k} < {Y_{k-2}}$ & ($a_k$=−1) ))

& (flagA=1) & (flagB=1)), flip($a_{k-3}$)

else if (((${Y_{k-3}} > {Y_{k-1}}$ & ($a_k$=+1)) or ($Y_{k-3} < Y_{k-1}$ & ($a_k$=−1) ))

& (flagA=1) & (flagB=1)), flip($a_k$)

flip: if bit is +1, change to −1, or else if bit is −1 change to +1

Rule 2: This rule is applied only when $\{a_k, a_{k-1}, a_{k-2}\} = \pm\{+-+\}$ in the observation window.

Observation Window

FIG. 8

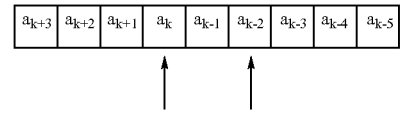

X: + or −

↑: Location of probable change in sign

If observation window has ±{-+++-+×××} or ±{--++-+×××}, flagA is set to 0, otherwise to 1, and if observation window has ±{×××+-+++-} or ±{×××+-++--}, flagB is set to 0, otherwise to 1.

Bit Flipping Logic if ((flagA=1) & (flagB=1)), flip both $a_k$ and $a_{k-2}$.

It is to be appreciated that the logic for flags A and B in respect of Rule 2 are part of the present invention (as opposed to Rule 2 per se).

Rule 3: This rule is applied only when $\{a_{k+3}, \ldots, a_k, \ldots, a_{k-6}\} = \pm\{----+++---\}$ or $\pm\{---+++----\}$ in the observation window.

Observation Window

FIG. 9

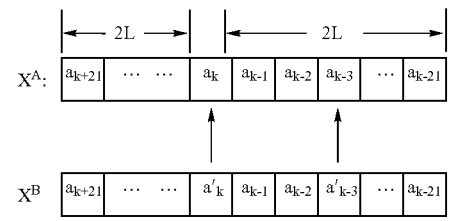

(.)': Compliment of (.)

↑: Location of probable change in sign

Sequence $X^A$ is the original sequence and Sequence $X^B$ is identical to the original sequence with $a_k$ and $a_{k-3}$ bits flipped.

Computation of Cumulative Errors $$e^A = \sum_{j=k-L}^{k+L}\left(y_j - \sum_{i=-L}^{i=L} X^A_{i+j-k+2L} f_i\right)^2$$

$$e^B = \sum_{j=k-L}^{k+L}\left(y_j - \sum_{i=-L}^{i=L} X^B_{i+j-k+2L} f_i\right)^2.$$

$y_j$: zero-threshold detector input sequence $f_j$: equalized channel response

Bit Flipping Logic

If $(e^B - e^A) < 0$, we need to flip both $a_k$ and $a_{k-3}$ bits in the original sequence. The bit flipping criterion on simplification reduces to $$4X_{2L}^A \sum_{j=k-L}^{k+L} \left( y_j - \sum_{\substack{i=-L, \\ i \neq k-j, \\ i \neq k-j+3}}^{L} X_{i+j-k+2L}^A f_i \right)(f_{k-j} - f_{k-j+3}) < 0, \quad (13)$$

which uses original sequence $X^A$ only.

Rule 4A: This rule is applied only when $\{a_{k+3}, \ldots, a_k, \ldots, a_{k-7}\} = \pm\{----+++---\}$ or $\pm\{---+++----\}$ in the observation window.

Observation Window

FIG. 10A

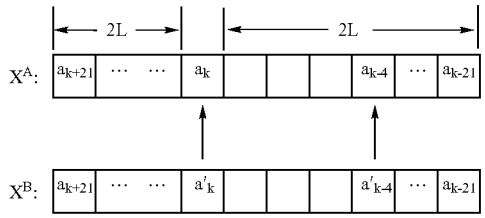

(.)': Compliment of (.)

↑: Location of probable change in sign

Sequence $X^A$ is the original sequence and Sequence $X^B$ is identical to the original sequence with $a_k$ and $a_{k-4}$ bits flipped.

Computation of Cumulative Errors $$e^A = \sum_{j=k-L}^{k+L} \left( y_j - \sum_{i=-L}^{i=L} X_{i+j-k+2L}^A f_i \right)^2$$

$$e^B = \sum_{j=k-L}^{k+L} \left( y_j - \sum_{i=-L}^{i=L} X_{i+j-k+2L}^B f_i \right)^2.$$

$y_j$: zero-threshold detector input sequence $f_j$: equalized channel response

Bit Flipping Logic

If $(e^B - e^A) < 0$, we need to flip both $a_k$ and $a_{k-3}$ bits in the original sequence. The bit flipping criterion on simplification reduces to $$4X_{2L}^A \sum_{j=k-L}^{k+L} \left( y_j - \sum_{\substack{i=-L, \\ i \neq k-j, \\ i \neq k-j+4}}^{L} X_{i+j-k+2L}^A f_i \right)(f_{k-j} - f_{k-j+4}) < 0, \quad (14)$$

which uses original sequence $X^A$ only.

Rule 4B: This rule is applied only when $\{a_{k+6}, \ldots, a_k, \ldots, a_{k-6}\} = \pm\{++++---+++---\}$ or $\pm\{+++---+++----\}$ in the observation window.

Observation Window

FIG. 10B

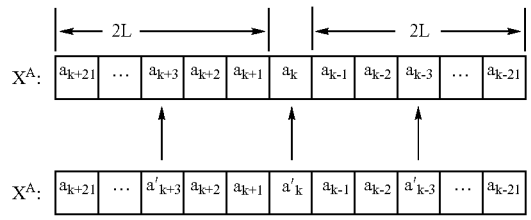

(.)': Compliment of (.)

↑: Location of probable change in sign.

Sequence $X^A$ is the original sequence and Sequence $X^B$ is identical to the original sequence with $a_{k+3}$, $a_k$ and $a_{k-3}$ bits flipped.

Computation of Cumulative Errors $$e^A = \sum_{j=k-L}^{k+L} \left( y_j - \sum_{i=-L}^{i=L} X_{i+j-k+2L}^A f_i \right)^2$$

$$e^B = \sum_{j=k-L}^{k+L} \left( y_j - \sum_{i=-L}^{i=L} X_{i+j-k+2L}^B f_i \right)^2.$$

$j_y$: zero-threshold detector input sequence $f_j$: equalized channel response.

Bit Flipping Logic

If $(e^B - e^A) < 0$, we need to flip both $a_{k+3}$, $a_k$ and $a_{k-3}$ bits in the original sequence.

The bit flipping criterion on simplification reduces to $$4X_{2L}^A \sum_{j=k-L}^{k+L} \left( y_j - \sum_{\substack{i=-L, \\ i \neq k-j, \\ i \neq k-j+3, \\ i \neq k-j-3}}^{L} X_{i+j-k+2L}^A f_i \right)(f_{k-j} - f_{k-j+3} - f_{k-j-3}) < 0, \quad (15)$$

which uses original sequence $X^A$ only.

Rule 5: This rule is applied only when $\{a_{k+3}, \ldots, a_k, \ldots, a_{k-3}\} = \pm\{++++---\}$ or $\pm\{+++----\}$ in the observation window.

Observation Window

FIG. 11

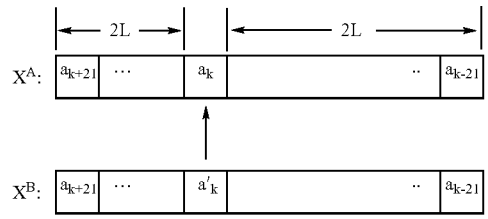

(.)': Compliment of (.)

↑: Location of probable change in sign

Sequence $X^A$ is the original sequence and Sequence $X^B$ is identical to the original sequence with $a_k$ bit flipped.

Computation of Cumulative Errors $$e^A = \sum_{j=k-L}^{k+L}\left(y_j - \sum_{i=-L}^{i=L} X^A_{i+j-k+2L} f_i\right)^2$$

$$e^B = \sum_{j=k-L}^{k+L}\left(y_j - \sum_{i=-L}^{i=L} X^B_{i+j-k+2L} f_i\right)^2.$$

$y_j$: zero-threshold detector input sequence
$f_j$: equalized channel response
Bit Flipping Logic
If ($e^B < e^A$), flip $a_k$ bit in original sequence. If ($e^B - e^A$)<0, need to flip $a_k$ bit in the original sequence. The bit flipping criterion on simplification reduces to $$4X^A_{2L}\sum_{j=k-L}^{k+L}\left(y_j - \sum_{\substack{i=-L,\\i\neq k-j}}^{L} X^A_{i+j-k+2L} f_i\right)(f_{k-j}) < 0, \quad (16)$$

which uses original sequence $X^A$ only.

Figure 12:
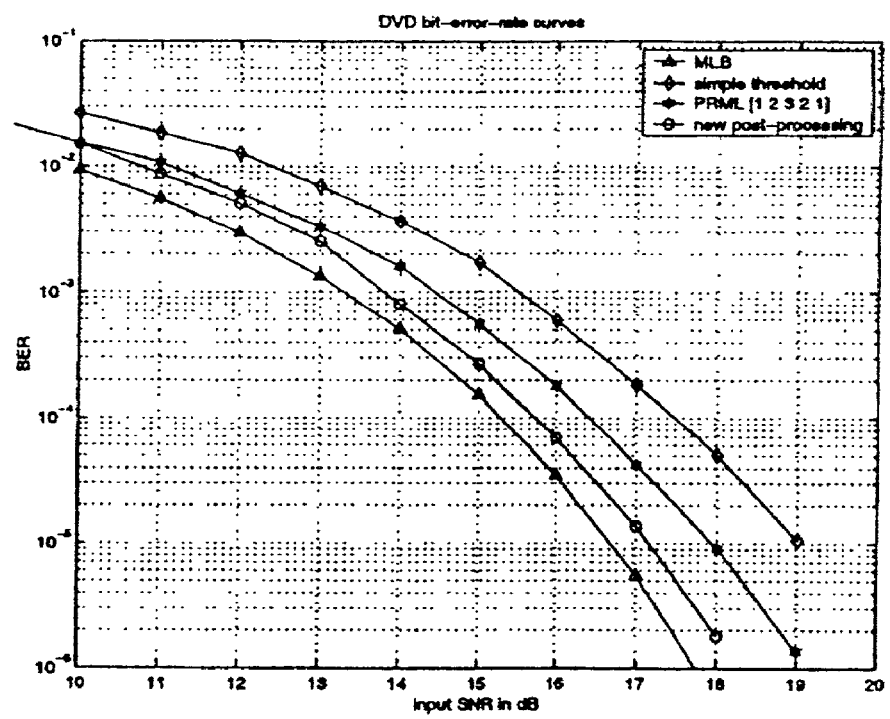
FIG. 12 shows a bit-error-rate comparison of the new detector of the invention with other conventional detectors on a DVD channel at a representative channel density of 4.23.

To illustrate the superior performance of the new scheme, there is provided a bit-error-rate performance comparison of different detectors (refer to FIG. 12). Detectors used for comparison are the simple threshold detector of the invention on 7-tap equalized target and the partial response Viterbi detector on 5-tap target for reference. Linear equalizers in all these detectors are designed using MMSE (minimum mean squared error) criterion. FIG. 12 gives the bit-error-rate comparison curves of different detectors on a representative DVD channel with channel density 4.23 for linear AWGN channel. In all the cases, 4 times oversampled 60 tap FIR filter is used for the equalizer and design SNR is chosen to be 18 dB. Maximum likelihood lower bound (MLB) is also shown in the figure, which is computed as the product of matched filter bound on the unequalized channel and the probability of data patterns supporting single bit error event (which is equal to the sum of probabilities of the patterns 3 and 4 in Tables 1 and 2). The superior performance of the new simple detector of the invention is clearly brought out in the figure. At the BER of 1e-5, the new detector provides more than 0.6 dB SNR gain compared to the reference 5-tap partial response Viterbi detector, and it is only 0.35 dB away from the MLB.

Figure 13:
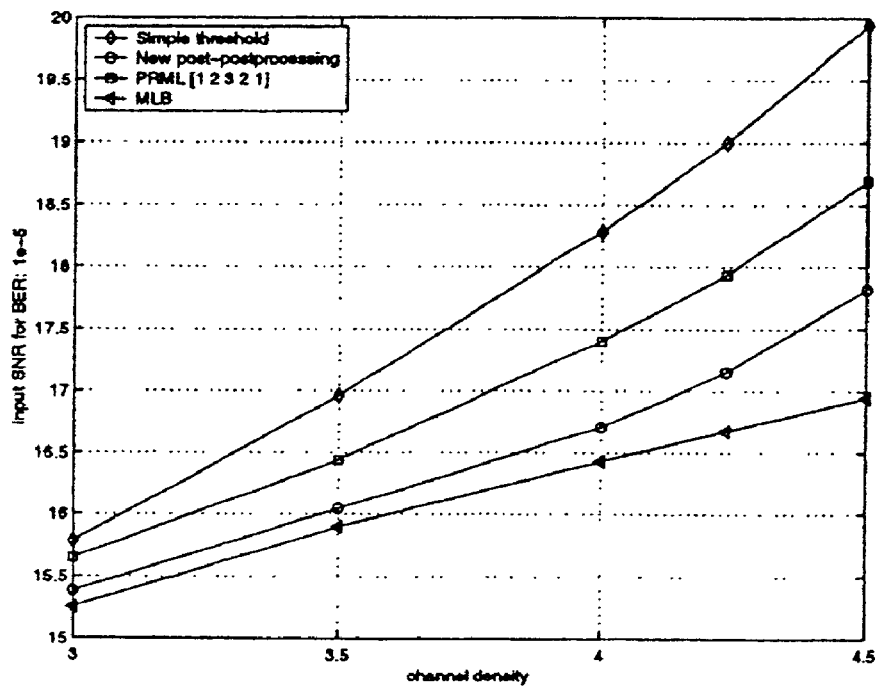
FIG. 13 shows constant bit-error-rate curves of the new detector of the invention and other detectors on a DVD channel for channel densities 3.00 to 4.5 (user densities: 1.5 to 2.25).

Considering a wide range of variations in the channel density (3 to 4.5) due to variations in system performances and choices of laser diodes, constant bit-error-rate curves of the detectors for channel densities 3.0 to 4.5 are given in FIG. 13. The performance of the new detector of the invention is close to MLB in the range below 4.5, and at higher densities, it is observed to be better than those of other detectors.

Having described the invention by reference to a specific embodiment, it is to be well understood that the embodiment is exemplary only and that modifications and variations thereto will occur to those possessed of appropriate skills without departure from the spirit and scope of the present invention as set forth in the appended claims. For example, whereas the described embodiment of the invention has five post-processing blocks arranged in a particular order to operate in accordance with specific rules, the same or similar technical effect might be obtainable in an alternative processing structure having more than or less than five post-processing blocks arranged in a different order. Further, it is to be appreciated that the present invention extends to using various error events and identifying various data-bit locations associated with various combinations of error bit patterns, and correcting the data-bits based on energy criteria corresponding to two or more data sequence pathways with or without the explicit use of such sequence pathways.

The invention claimed is:

1. A data processing apparatus comprising:
    means for generating a signal representative of recorded data on a data storage medium;
    filtering means for receiving the generated signal and equalizing the generated signal response at a predetermined level; and
    signal correcting means for detecting a plurality of multiple-bit data representative of the equalized signal and processing said multiple-bit data in dependence upon a predetermined set of data correction rules which, in operation of the apparatus, has the effect of enhancing the detection capability of the apparatus,
    wherein the set of data correction rules is selectively applied to a portion of the multiple-bit data, such application being based upon a comparison of said multiple-bit data with predetermined multiple-bit sequences and wherein the portion of the multiple-bit data are corrected in dependence upon the comparison, and wherein the data corrections are effected additionally in dependence upon the combination of bit-polarities of the detected data distribution.

2. A data processing apparatus as claimed in claim 1, wherein the multiple-bit data are corrected by interchanging and/or shifting the polarities of a number of data-bits at said portion of the multiple-bit data.

3. A data processing apparatus as claimed in claim 1, wherein the set of data correction rules is selectively applied at a plurality of data-bit locations associated with said portion.

4. A data processing apparatus as claimed in claim 1, wherein the data corrections are effected in a manner which takes account of amplitude variations in the signal representation of the recorded data and the detected data.

5. A data processing apparatus as claimed in claim 1, wherein the filtering means is arranged to provide an enhancement of the generated signal response to be detected.

6. A data processing apparatus as claimed in claim 5, wherein said response is subject to a certain target distribution.

7. A data processing apparatus as claimed in claim 1, wherein the signal correcting means comprises a zero-threshold detector.

8. A data processing apparatus as claimed in claim 7, further comprising processing means connected to the output side of the detector.

9. A data processing apparatus as claimed in claim 8, wherein said processing means comprises a plurality of interconnectable processors, each processor being operable to correct the data in accordance with one or more different correction criteria for enhancing the detection capability of the apparatus.

10. A data processing apparatus as claimed in claim 2, wherein the set of data correction rules is selectively applied at a plurality of data-bit locations associated with said portion.

11. A data processing apparatus as claimed in claim 2, wherein the data corrections are effected in a manner which takes account of amplitude variations in the signal representation of the recorded data and the detected data.

12. A data processing apparatus as claimed in claim 3, wherein the data corrections are effected in a manner which takes account of amplitude variations in the signal representation of the recorded data and the detected data.

13. A data processing apparatus as claimed in claim 10, wherein the data corrections are effected in a manner which takes account of amplitude variations in the signal representation of the recorded data and the detected data.

14. A data processing apparatus as claimed in claim 1, wherein the multiple-bit data are corrected by interchanging and/or shifting the polarities of a number of data-bits at said portion of the multiple-bit data.

15. A data processing apparatus as claimed in claim 1, wherein the set of data correction rules is selectively applied at a plurality of data-bit locations associated with said portion of the multiple-bit data.

16. A data processing apparatus as claimed in claim 14, wherein the set of data correction rules is selectively applied at a plurality of data-bit locations associated with said portion of the multiple-bit data.

* * * * *